United States Patent
Yang

Patent Number: 6,040,595
Date of Patent: Mar. 21, 2000

[54] STRUCTURE OF A NON-DESTRUCTIVE READOUT DYNAMIC RANDOM ACCESS MEMORY

[75] Inventor: Yu-Hao Yang, Hsinchu Hsien, Taiwan

[73] Assignee: Winbond Electronics Corp., Hsinchu, Taiwan

[21] Appl. No.: 09/080,131

[22] Filed: May 15, 1998

[30] Foreign Application Priority Data

Mar. 13, 1998 [TW] Taiwan ................................. 87103702

[51] Int. Cl.⁷ ................................................ H07L 27/108
[52] U.S. Cl. .......................... 257/300; 257/301; 257/306
[58] Field of Search .................... 257/300, 301, 257/606

[56] References Cited

U.S. PATENT DOCUMENTS

| | | | |
|---|---|---|---|
| 5,146,300 | 9/1992 | Hamamoto et al. | 257/300 |
| 5,327,374 | 7/1994 | Krautschneider et al. | 257/300 |
| 5,463,234 | 10/1995 | Toriumi et al. | 257/300 |
| 5,498,889 | 3/1996 | Hayden | 257/300 |
| 5,559,733 | 9/1996 | McMillan et al. | 257/300 |
| 5,689,456 | 11/1997 | Kobayashi | 365/145 |
| 5,753,946 | 5/1998 | Naiki et al. | 365/145 |

FOREIGN PATENT DOCUMENTS 61-251064  11/1986  Japan ..................... 257/300

*Primary Examiner*—David Hardy
*Attorney, Agent, or Firm*—Thomas, Kayden, Horstemeyer & Risley

[57] ABSTRACT

A structure of dynamic random access memory includes a field effect transistor (FET), a capacitor, a world line and a bit line. The gate of the FET is electrically coupled to the word line in which a voltage source is supplied through the world line to the gate. The drain region of the FET is electrically coupled to a lower electrode of the capacitor. The capacitor has an upper electrode being electrically coupled to the gate of the FET either. The source region of the FET is electrically coupled to the bit line.

15 Claims, 4 Drawing Sheets

STRUCTURE OF A NON-DESTRUCTIVE READOUT DYNAMIC RANDOM ACCESS MEMORY

CROSS-REFERENCE TO RELATED APPLICATION

This application claims the priority benefit of Taiwan application serial no. 87103702, filed Mar. 13, 1998, the full disclosure of which is incorporated herein by reference.

BACKGROUND OF THE INVENTION

1. Field of the Invention

This invention relates to a structure of an integrated circuit (IC), and more particularly to a structure of a dynamic random access memory (DRAM).

2. Description of Related Art

When the function of a micro processor is continuously enhanced and, in accordance with, the abilities of software including the program size and the computing power are increased, the capacitance of memory is enlarged accordingly. As the integration of DRAM is increased, the memory cell for the present development includes a field effect transistor (FET) and a storage capacitor. FIG. 1 is the configuration of the circuit of the memory cell in a DRAM device. In FIG. 1, the selected capacitor C, one of an array of capacitors built on the wafer, can be used to store the data by either charging or discharging the capacitor C. The most common strategy is that a binary data stored on a bit has a logic state of "0" as the capacitor C being discharged and has a logic state of "1" as the capacitor C being charged. In general, a dielectric thin film 101 is sandwiched between an upper electrode 100 and a lower electrode 102 of the capacitor C to provide a required dielectric constant. The capacitor C is coupled to a bit line BL and fulfills the action of read/write through charging or discharging the capacitor C by utilizing the FET T as a switch. The action as described above is done by the following procedure that the FET T is coupled between the bit line BL and the capacitor C which is coupled to the voltage source V. A word line WL is coupled to the gate of FET T to selectively control the connecting status between the bit line BL and capacitor C.

FIG. 2 schematically illustrates a sectional view of a conventional DRAM. Referring to FIG. 2, a DRAM is formed over a substrate 200. The substrate 200 has a starting surface is called a substrate surface, on which a structure of the DRAM is based. Then, an isolation area 202, usually being called as a field oxide (FOX), is formed on the substrate. Next, a gate 204 is formed on the substrate surface. Next, an interchangeable source/drain region is formed below the substrate surface. The interchangeable source/drain region includes a number of separated regions such as the interchangeable source/drain region 206, 207. Next, a dielectric layer 208 is formed over the substrate 200. Next, a contact window 210 is defined on the dielectric layer 208. Next, a conductive layer 212 is formed over the dielectric layer 208 covering and filling the contact window 210 so that it is electrically coupled to the interchangeable source/drain region 206 and is treated as a lower electrode of a capacitor of a DRAM. Next, a dielectric thin film 214 made of one such as silicon-nitride/oxide (NO) or oxide/silicon-nitride/oxide (ONO) is formed over the conductive layer 212. Next, a conductive layer 216 is formed over the dielectric thin film 214 to be treated as an upper electrode and to form a capacitor. Next, a dielectric layer 218 is formed over the substrate 200 and the conductive layer 216. Next, a contact window 220 is defined on the dielectric layer 218 and is filled in a metal layer to act as the BL 222. And next, the conductive layer 216, the upper electrode, is to be coupled to the voltage source V as shown in FIG. 1.

The conventional DRAM as described above needs the conductive layer 216 for the upper electrode, in which the upper electrode needs a connection to the voltage source usually through a metal line. This not only increases the complexity and cost of the fabrication but also increases the layout area of the IC chip. Further, this conventional connection between the upper electrode and the voltage source is no longer efficient for a highly integrated semiconductor product and even causes the degradation of the operation speed due to the distance of the connection being too long.

SUMMARY OF THE INVENTION

It is therefore an object of the invention to provide a structure and a circuit of a DRAM for solving the problems as described above. The circuit in the DRAM allows the upper electrode to be coupled to the WL for using the voltage source of the WL. The upper electrode, therefore, needs not the extra connection to the voltage source.

It is an another object of the present invention to provide a structure and a circuit of a DRAM for reducing the fabricating complexity and the cost. The gate of the FET and the upper electrode are coupled closely together in the fabricating procedure so that the fabricating procedure is simplified and the cost is reduced. Moreover due to the connection between the upper electrode and the gate of the FET being effectively reduced, the layout area of the IC chip can be reduced and the operation speed can be improved due to the connection distance is reduced.

In accordance with the foregoing and other objects of the invention, a structure of a DRAM on a substrate is utilizing a metal plug on an isolation layer for an electrical coupling between an upper electrode of a trench type capacitor and a gate of a FET. The FET is built on the substrate and includes a gate, a source and a drain. The isolation layer is for the isolation between neighboring FETs. The voltage source of the gate is commonly used for the capacitor and is applied on the upper electrode of the capacitor.

In the foregoing, the structure of a DRAM built on a substrate is including a FET, a lower electrode, a dielectric thin film, an upper electrode and an isolation layer. The FET includes a gate, a source and a drain. The lower electrode, the dielectric thin film and the upper electrode are composed as a trench type capacitor below a substrate surface. The drain is directly electrically coupled to the lower electrode. The isolation layer for the isolation for the neighboring FETs is on the substrate surface and over almost all of the trench type capacitor. There is an aperture on the isolation layer to expose the upper electrode. A metal plug on the gate, through the aperture of the isolation layer, allows the gate to be electrically coupled to the upper electrode. Then an outer dielectric layer is over the substrate with a contact window. A WL is electrically coupled to the source of the FET through the contact window on the outer dielectric layer.

In the foregoing, the structure of a DRAM built on a substrate is including a FET, a dielectric layer, a lower electrode, a dielectric thin film, an upper electrode and an isolation layer. The FET includes a gate, a source and a drain. The dielectric layer is over the substrate and the FET but has two openings to expose the gate and the drain separately. The lower electrode is over the dielectric layer but not over the gate and fills the opening to be electrically coupled to the drain. The dielectric thin film is over the exposed periphery of the lower electrode. The upper electrode is over the dielectric thin film and the dielectric layer and fills the other opening of the dielectric layer to be electrically coupled to the gate of the FET. The lower electrode, the dielectric thin film and the upper electrode are composed as a capacitor, which is electrically coupled to the gate and the drain of the FET. Thus, the voltage source from the WL is commonly used by the gate and the capacitor for the operation of a read/write function without an extra connection for supplying the voltage for the capacitor. Then an outer dielectric layer is over the substrate with a contact window to expose the source. A WL is electrically coupled to the source of the FET through the contact window.

In the foregoing, the structure of a DRAM built on a substrate is including a FET, a dielectric thin film, a lower electrode and a dielectric layer. The FET includes a gate, a source and a drain. The dielectric thin film is over the FET but leaves two openings for exposing the drain and the source separately. The lower electrode is over the dielectric thin film covering the gate and the drain and fills the opening to be electrically coupled to the drain. The gate is acting the upper electrode either so that a capacitor is formed. Then an outer dielectric layer is over the substrate with a contact window to expose the source. A WL is electrically coupled to the source of the FET through the contact window, where is also the place of the other opening of the dielectric thin film.

In short conclusion, the invention has provided the configuration of circuit of the DRAM to let the upper electrode of the capacitor be electrically coupled to the gate which has the voltage source from the WL without the extra connection to another voltage source for the capacitor. The configuration of circuit is not affecting the function of the read/write. Thus, the fabricating procedure can be simplified and then the fabricating cost is reduced either. Moreover, since the coupling length between the upper electrode and the voltage source can be reduced in the circuit, the size of the IC chip can be reduced accordingly and the operation speed can be improved either.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENTS

EXAMPLE 1

Figure 1:
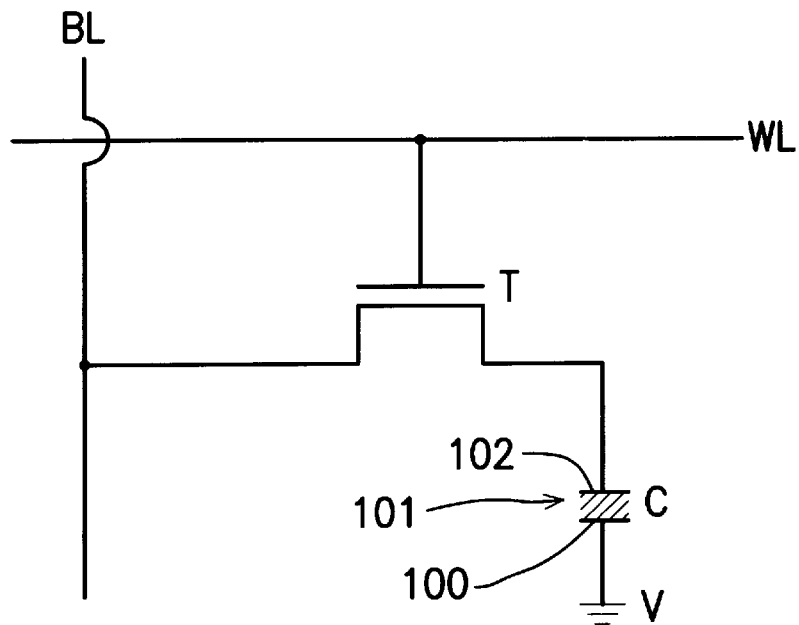
FIG. 1 schematically illustrates a configuration of a circuit of a memory cell in a conventional DRAM device.
Figure 2:
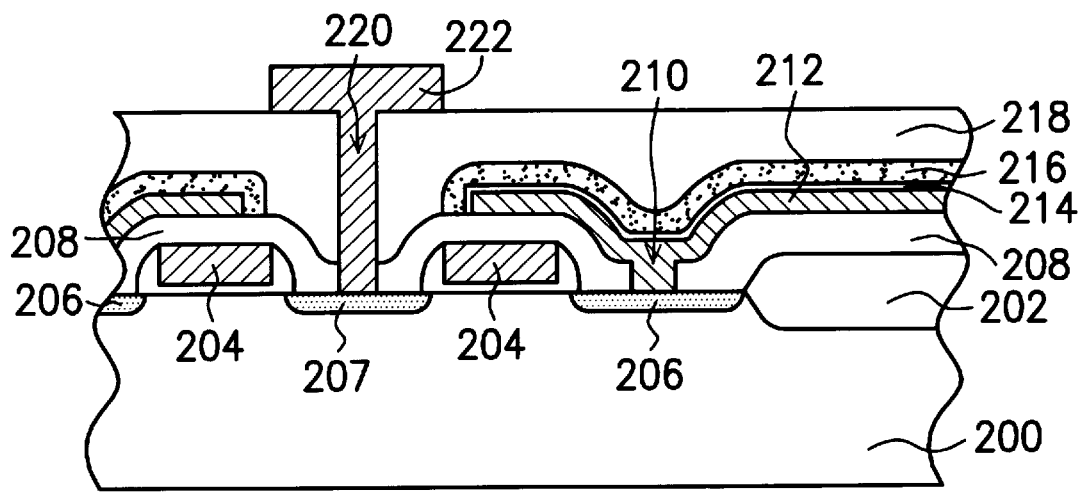
FIG. 2 schematically illustrates a sectional view of a conventional DRAM.
Figure 3:
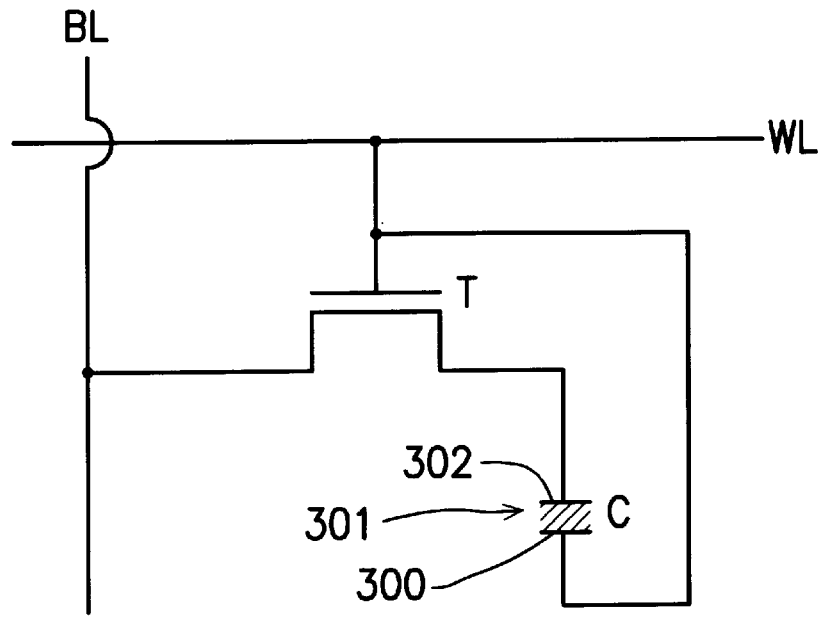
FIG. 3 schematically illustrates a configuration of a circuit of a memory cell of a DRAM device, according to the preferred embodiments of the invention.

FIG. 3 schematically illustrates a configuration of a circuit of a memory cell of a DRAM device, according to the preferred embodiments of the invention. Referring to FIG. 3, similarly to FIG. 1, the circuit has a WL, a BL, a FET T and a capacitor C. The modification in the invention is that an upper electrode 300 of the capacitor C is electrically coupled to the gate of the FET T and the lower electrode 302 is electrically coupled to the drain of the FET T. The dielectric layer 301 is mediated between the electrodes 300, 302.

Because the voltage on the upper electrode 300 is not affecting the read/write of the DRAM, the invention can utilize the voltage source for the gate from the WL as the voltage source. This becomes one of the properties of the invention. The operation of read/write of data is depending on the selected WL and the BL to charge or discharge the capacitor C.

Figure 4A:
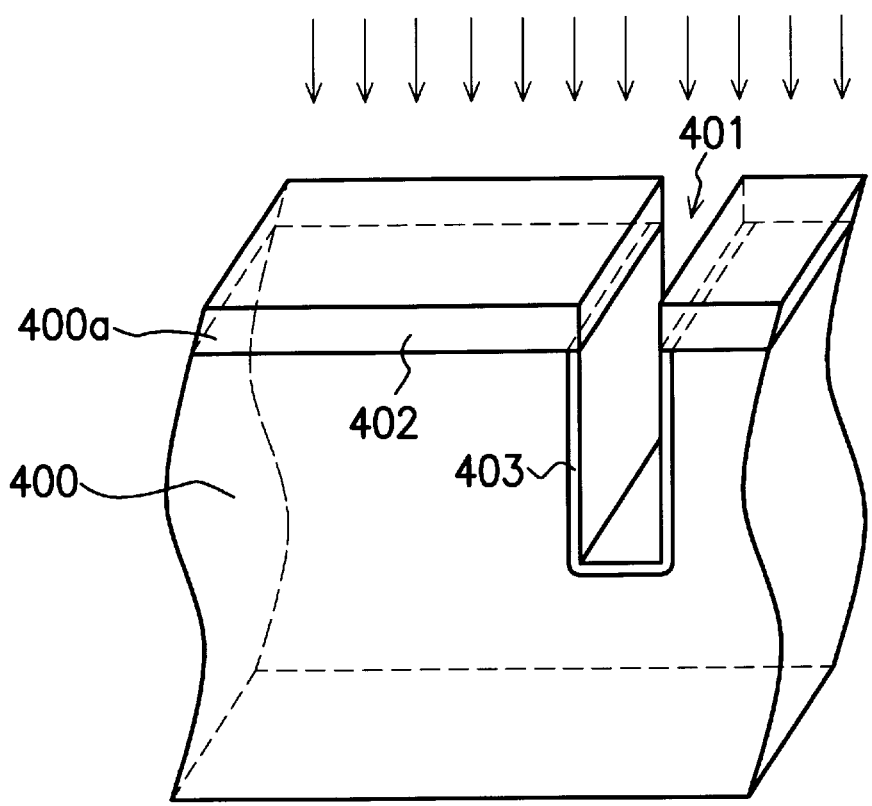
FIGS. 4A–4C schematically illustrate a sectional view of a DRAM in a fabricating procedure, according to the first preferred embodiment of the invention.

According to the configuration of circuit the FIG. 3, FIGS. 4A–4C schematically illustrate a sectional view of the DRAM in a fabricating procedure, according to the first preferred embodiment of the invention. Referring to FIG. 4A, a substrate 400 with a substrate surface 400a is first provided. Over the substrate surface 400a, a photo mask 402 is formed and an opening 401 is defined by an anisotropic etching on the substrate 400 below the substrate surface 400a. Then, a doped conductive layer 403 is formed over a periphery of the opening 401.

Figure 4B:
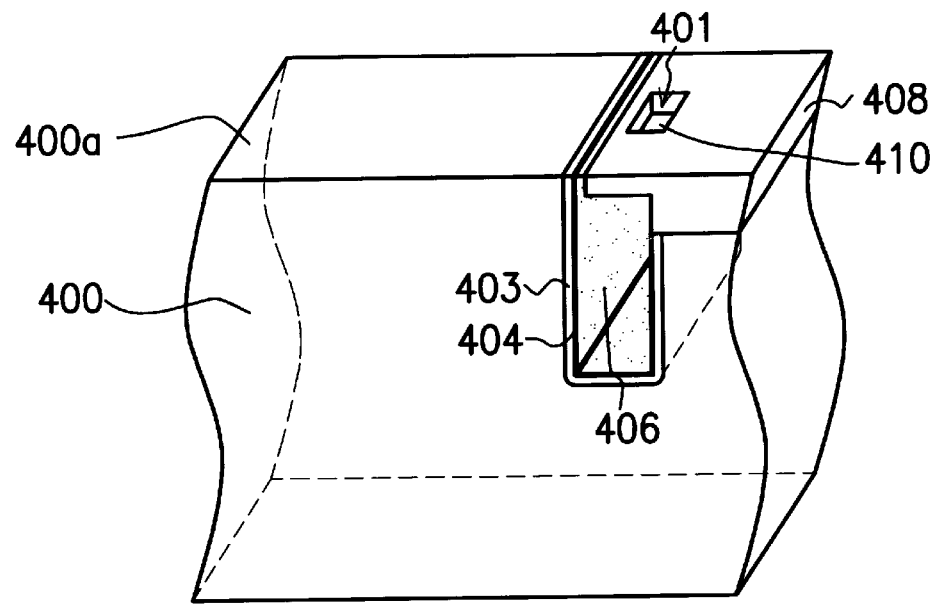

Referring to FIG. 4B, after the photo mask 402 is removed, a dielectric thin film 404 is over the conductive layer 406 is formed to fill the opening 401, in which the conductive layer 403 and 406 act as the lower and the upper electrode of a capacitor on the opening 401, respectively. The capacitor is a trench type capacitor. The dielectric thin film 404 has a thickness about between 10 and 60 Angstrom and can include one such as $SiO_2$, NO, ONO, $Ta_2O_5$, Pb(Zr, Ti)$O_3$ (PZT), (Ba, Sr)TiO$_3$ (BST) or other with high dielectric constant. The conductive layer 406 can be formed by a method of chemical vapor deposition (CVD) to deposit a polysilicon layer and be doped with N-type of As ion to improve the conductivity. Then an isolation layer over a portion of the capacitor on the opening 401 is for the isolation between neighboring FETs. There is an aperture 410 on the isolation layer to expose the conductive layer 406. The formation of the isolation layer can utilize a method of shallow trench isolation (STI) to form a shallow trench on the substrate surface 400a and fill in silicon dioxide on the shallow trench by CVD.

Figure 4C:
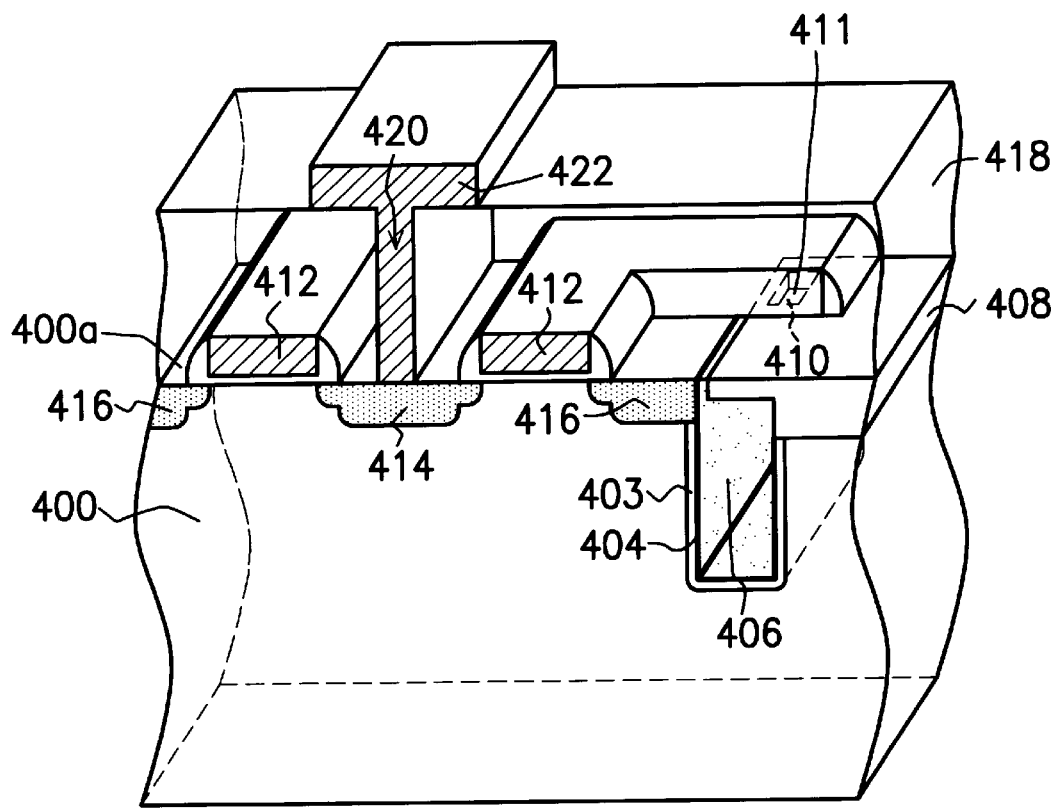

Referring to FIG. 4C, a gate 412 is formed on the substrate surface 400a. A source 414 and a drain 416 are formed below the substrate surface 400a, which together with the gate compose a FET. The drain 416 is directly electrically coupled to the lower electrode 403 below the substrate surface 400a. The gate 412 can be electrically coupled to the upper electrode 406 by using a metal plug 411 through the aperture 410. Then a dielectric layer 418 is formed over the substrate 400 with a contact window 420 being defined to expose the source 414 of the FET. A conductive layer 422 fills the contact window 420 to act as a BL. The dielectric layer 418 includes silicon dioxide or boron-phospho-silicate glass (BPSG) and the conductive layer 422 includes aluminum or doped polysilicon.

In the first preferred embodiment as described above, the upper electrode 406, the metal plug 411 and the gate 412 are electrically coupled together through the aperture 410 on the isolation layer 408 and is to be coupled to the WL. Therefore, there is no need of an extra voltage source and connection for the upper electrode 406.

EXAMPLE 2

Figure 5:
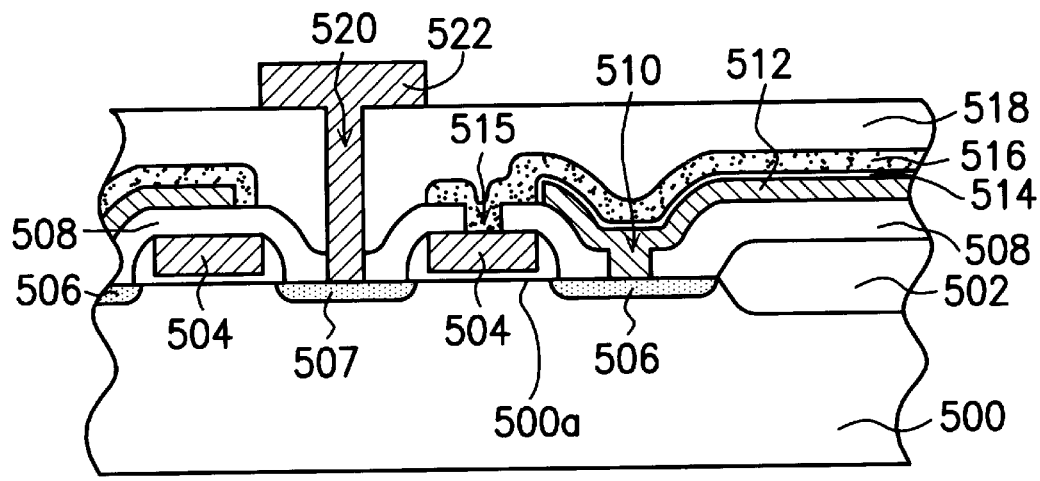
FIG. 5 schematically illustrates a sectional view of a DRAM, according to the second preferred embodiment of the invention.

FIG. 5 is a sectional view of a DRAM, according to the second preferred embodiment of the invention. Referring to FIG. 5, a gate 504, a drain 506 and a source 507 are formed on a substrate 500 to be a FET. The drain 506 and the source 507 are below the substrate surface 500a. An isolation layer 502 is formed to isolate the neighboring FETs. Then a dielectric layer 508 is over the substrate, in which the dielectric layer 508 is defined to form an opening 510 to expose the drain 506 and an another opening 515 to expose the gate 504. The formation of the dielectric layer 508 is preferably using the method of CVD and including silicon dioxide or BSPG. Above the opening 510, a conductive layer 512 is formed over the dielectric layer 508 and fill the opening 510 but not the another opening 515. Thus, the conductive layer 512 is electrically coupled to the drain but not the gate and is to act as a lower electrode 512 of a capacitor in the DRAM. The capacitor is to be described later. The formation of the conductive layer 512 is preferably using the method of CVD and including doped polysilicon. Next, a dielectric thin film 514 with a thickness about between 10 and 60 Angstrom is formed over the conductive layer 512. The dielectric thin film 514 includes one such as $SiO_2$, NO, ONO, $Ta_2O_5$, $Pb(Zr, Ti)O_3$ (PZT), $(Ba, Sr)TiO_3$ (BST) or other with high dielectric constant.

Next, a conductive layer 516 is formed over the dielectric thin film 514 and the dielectric layer 508 and fill the another window 515 of the dielectric layer 508. Thus, the conductive layer 516 is electrically coupled to the gate 504 and is to act as an upper electrode 516 of the capacitor, which is formed and is electrically coupled to the drain and the gate through the lower electrode 512 and the upper electrode 516, respectively. The formation of the conductive layer 516 is preferably using the method of CVD and including doped polysilicon with, for example, a dopant of As ion for N-type to increase the conductivity.

Moreover, a dielectric layer 518 is formed over the substrate 500 with a contact window 520 to expose the source 507. The contact window 520 is formed by defining on the dielectric layer 518. And then, a conductive layer 522 fills the contact window 520 is to be electrically coupled to the source so that the conductive layer 522 is acting as the BL.

In the second preferred embodiment of the invention, the upper electrode 516 is electrically coupled to the gate 504 and use the same voltage source supplied from the WL. This results in a simplification of the fabricating procedure and, therefore, a reduction of the fabricating cost. Further, the size of the DRAM can be reduced and the operation speed of read/write can be enhanced either.

EXAMPLE 3

Figure 6:
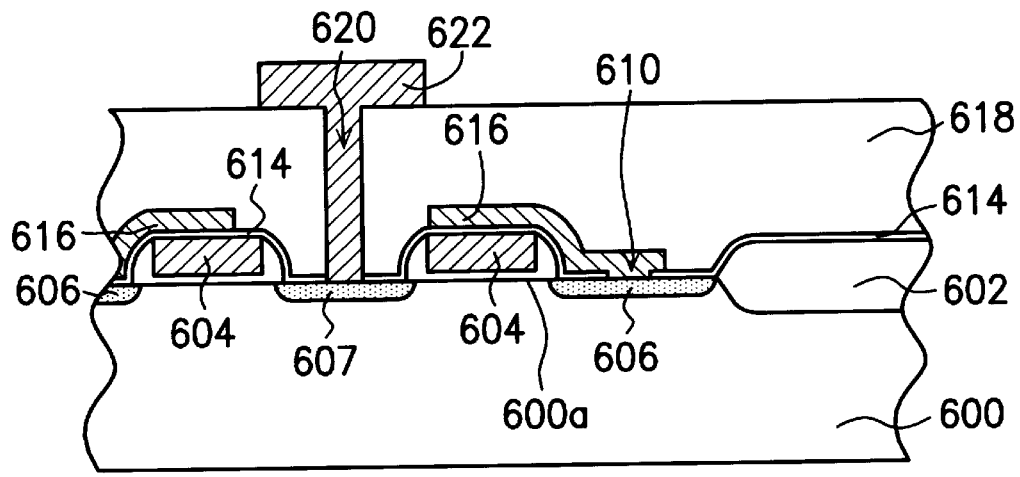
FIG. 6 schematically illustrates a sectional view of a DRAM, according to the third preferred embodiment of the invention.

FIG. 6 schematically illustrates a sectional view of a DRAM, according to the third preferred embodiment of the invention. Referring to FIG. 6, a substrate 600 with a substrate surface 600a is provided first. A gate 604, a drain 606 and a source 607 are formed on the substrate 600 to be a FET. An isolation layer 602 is formed on the substrate surface 600a for the isolation between neighboring FETs. The drain 606 and the source 607 are below the substrate surface 600a. Then, a dielectric thin film 614 is over the substrate but is defined to form an opening 610 to expose the drain 606 and an another opening 620 to expose the source 607. The dielectric thin film 614 has a thickness about between 10 and 60 Angstrom and includes one such as $SiO_2$, NO, ONO, $Ta_2O_5$, $Pb(Zr, Ti)O_3$ (PZT), $(Ba, Sr)TiO_3$ (BST) or other with high dielectric constant.

Following that, a conductive layer 616 is over the dielectric thin film 614 around the drain 606 and fills the opening 610 to be electrically coupled to the drain 606 so that the conductive layer 616 acts as a lower electrode 616 either. The gate 604 by itself is acting as an upper electrode 604. Therefore a capacitor of the DRAM is formed. Then, a dielectric layer 618 is formed over the substrate 600 with a contact window 620 being defined to expose the source 607. The dielectric layer 618 is formed preferably using the method of CVD and including silicon dioxide or BSPG. And then, a conductive layer 622 fills the contact window 620 to be electrically coupled to the source 607 and to act as the BL. The conductive layer 622 includes Aluminum or doped polysilicon.

In the third preferred embodiment of the invention as described above, the gate 604 by itself is acting as the upper electrode 604 so that the capacitor of the DRAM is using the same voltage source as the one supplied for the gate 604 from the WL. Since the capacitor is utilizing the gate 604 as the upper electrode directly, there is no need of a mediate dielectric layer between the gate 604 and the drain 606. This structure of the DRAM results in a simplification of the fabricating procedure and, therefore, a reduction of the fabricating cost. Further, the size of the DRAM can be reduced and the operation speed of read/write can be enhanced either.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of a circuit of a dynamic random access memory (DRAM), the structure of the circuit comprising:

a word line; wherein the word line supplies a voltage source;

a bit line;

a capacitor; wherein the capacitor in the DRAM is used for the storing a binary data and comprises a lower electrode and an upper electrode;

a field effect transistor (FET); wherein the FET comprises a gate being electrically coupled to the word line, a source region being electrically coupled to the bit line and a drain region being electrically coupled to the lower electrode of the capacitor; and a coupling structure of the capacitor, wherein the upper electrode of the capacitor is electrically coupled to the word line.

2. A structure of a dynamic random access memory (DRAM), the structure comprising:

a field effect transistor (FET), wherein the FET further comprises a gate, a source region and a drain region; and a capacitor, wherein the capacitor further comprises a lower electrode and an upper electrode, in which the upper electrode is electrically coupled to the drain region.

3. The structure of claim 2, wherein the structure further comprises a bit line, which is electrically coupled to the source region of the FET.

4. The structure of claim 2, wherein the structure further comprises a word line, which is electrically coupled to the gate of the FET.

5. The structure of claim 2, wherein the gate is treated as the upper electrode.

6. A structure of a dynamic random access memory (DRAM), the structure comprising:
- a field effect transistor (FET), wherein the FET further comprises a gate, a source region and a drain region;
- a capacitor, wherein the capacitor further comprises a lower electrode and an upper electrode, in which the upper electrode is electrically coupled to the gate and the lower electrode is electrically coupled to the drain region;
- a bit line, wherein the bit line is electrically coupled to the source region of the FET; and
- a word line, wherein the word line is electrically coupled to the gate of the FET.

7. The structure of claim 6, wherein the gate is treated as the upper electrode.

8. A structure of a dynamic random access memory (DRAM), the structure comprising:
- a substrate, wherein the substrate with a substrate surface comprises an opening below the substrate surface and an inner periphery of the opening;
- a capacitor, wherein the capacitor is located in the opening and comprises a first electrode, a dielectric thin film and a second electrode, which are sequentially over the inner periphery of the opening;
- an insulating layer; wherein the insulating layer is over a portion of the capacitor and comprises an aperture to expose the second electrode;
- a metal plug; wherein the metal plug is electrically coupled to the second electrode through the aperture of the isolation layer;
- a field effect transistor (FET), wherein the FET is on the substrate and comprises a gate, a source region and a drain region, in which the source region and the drain region is below the substrate surface; and
- a coupling; wherein the coupling comprises that the gate is electrically coupled to the second electrode through the metal plug and the drain region is electrically coupled to the first electrode.

9. A structure of a dynamic random access memory (DRAM), the structure comprising:
- a substrate, wherein the substrate with a substrate surface comprises an opening below the substrate and an inner periphery of the opening;
- a field effect transistor (FET), wherein the FET is on the substrate and comprises a gate, a source region and a drain region, in which the source region and the drain region is below the substrate surface and the gate is above the substrate surface;
- a dielectric layer over the substrate and the gate, wherein the dielectric layer comprises a first opening to expose the gate and a second opening to expose the drain region;
- a first electrode; wherein the first electrode is over the dielectric layer around the second opening layer to be electrically coupled to the drain region through the second opening, but the first opening still exposes the gate;
- a dielectric thin film over the first electrode; and
- a second electrode; wherein the second electrode covers the dielectric thin film and a portion of the dielectric layer, where comprises the first opening, so that the second electrode is electrically coupled to the gate through the first opening.

10. A dynamic random access memory (DRAM), comprising:
- a substrate, wherein the substrate with a substrate surface comprises an opening below the substrate surface and an inner periphery of the opening;
- a field effect transistor (FET), wherein the FET is on the substrate and comprises a gate, a source region and a drain region, in which the source region and the drain region is below the substrate surface and the gate is above the substrate surface;
- a dielectric thin film over the substrate and the gate, wherein the dielectric thin film comprises a drain opening to expose the drain region; and
- a conductive layer, wherein the conductive layer is located over the dielectric thin film and is electrically coupled to the drain region through the drain opening of the dielectric thin film.

11. The DRAM of claim 10, wherein the dielectric thin film has a thickness about between 10 and 60 Angstrom.

12. The DRAM of claim 10, wherein the dielectric thin film comprises silicon-dioxide/silicon-nitride/silicon-dioxide.

13. The DRAM of claim 10, wherein the dielectric thin film comprises $Ta_2O_5$.

14. The DRAM of claim 10, wherein the dielectric thin film comprises PZT.

15. The DRAM of claim 10, wherein the dielectric thin film comprises BST.

* * * * *